United States Patent
Zhou et al.

(10) Patent No.: US 11,860,243 B2
(45) Date of Patent: Jan. 2, 2024

(54) PLUG STATUS DETECTION CIRCUIT, CONTROLLER, AND VEHICLE

(71) Applicant: Huawei Digital Power Technologies Co., Ltd., Shenzhen (CN)

(72) Inventors: Lei Zhou, Shenzhen (CN); Xiaoqiu Li, Dongguan (CN)

(73) Assignee: HUAWEI DIGITAL POWER TECHNOLOGIES CO., LTD., Guangdong (CN)

( * ) Notice: Subject to any disclaimer, the term of this patent is extended or adjusted under 35 U.S.C. 154(b) by 210 days.

(21) Appl. No.: 17/566,291

(22) Filed: Dec. 30, 2021

(65) Prior Publication Data

US 2022/0214408 A1    Jul. 7, 2022

(30) Foreign Application Priority Data

Jan. 11, 2021   (CN) .......................... 202110029727.2

(51) Int. Cl.
    *G01R 31/69*    (2020.01)
    *B60L 53/66*    (2019.01)
    *B60L 53/16*    (2019.01)

(52) U.S. Cl.
    CPC .............. *G01R 31/69* (2020.01); *B60L 53/16* (2019.02); *B60L 53/66* (2019.02)

(58) Field of Classification Search
    CPC ......... G01R 31/69; B60L 53/16; B60L 53/66; Y02T 10/70; Y02T 10/7072; Y02T 90/14
    See application file for complete search history.

(56) References Cited

U.S. PATENT DOCUMENTS

| | | | |
|---|---|---|---|
| 10,363,825 | B2 * | 7/2019 | Rao ......................... B60L 58/10 |
| 2015/0212135 | A1 | 7/2015 | Jin et al. |
| 2018/0208066 | A1 | 7/2018 | Rao et al. |

FOREIGN PATENT DOCUMENTS

| | | |
|---|---|---|
| CN | 111193311 A | 5/2020 |
| DE | 102018215696 A1 | 3/2020 |
| JP | 2015142511 A | 8/2015 |

OTHER PUBLICATIONS

Triac, From Wikipedia, https://en.wikipedia.org/w/index.php?title=TRIACandoldid=995931115, last edited on Dec. 23, 2020, Total 9 Pages.
Triode vacuum tube, From Wikipedia, https://ja.wikipedia.org/w/index.php?title=%E4%B8%89%E6%A5%B5%E7%9C%9F%E7%A9%BA%E7%AE%A1andoldid=79913845%3E, Last update Thursday, Dec. 1, 2022, Total 8 Pages.

* cited by examiner

*Primary Examiner* — G. M. A Hyder
(74) *Attorney, Agent, or Firm* — WOMBLE BOND DICKINSON (US) LLP

(57) ABSTRACT

A plug status detection circuit, a controller, and a vehicle are provided, to detect a plug status in different standards by using one detection circuit. The plug status detection circuit includes a wake-up circuit and a sampling circuit. The wake-up circuit is configured to immediately output or delay outputting a wake-up signal based on a resistance value of a connected resistor of the plug status detection circuit when a plug is connected to a socket, where the wake-up signal is used to trigger a CPU to drive the sampling circuit. The sampling circuit is configured to inject a startup voltage under the drive of the CPU, and after the startup voltage is injected, a level of a detection point of the sampling circuit is used to indicate a plug status.

20 Claims, 11 Drawing Sheets

PLUG STATUS DETECTION CIRCUIT, CONTROLLER, AND VEHICLE

CROSS-REFERENCE TO RELATED APPLICATION

This application claims priority to Chinese Patent Application No. 202110029727.2, filed on Jan. 11, 2021, which is hereby incorporated by reference in its entirety.

TECHNICAL FIELD

This application relates to the field of new energy vehicle technologies, in particular to a plug status detection circuit, a controller, and a vehicle.

BACKGROUND

With the development of technologies in the field of new energy, the application of new energy vehicles is becoming more popular, for example, electric vehicles/hybrid electric vehicles. At present, alternating current charging of new energy vehicles has three standards, namely, a United States standard (US standard for short), a European standard (EU standard for short), and a Chinese standard (GB standard for short), which stipulate a connection and a control guidance between a new energy vehicle and a charging pile. A new energy vehicle may interact with a charging pile through a plug status signal. In the EU standard and the US standard, the plug status signal is also referred to as a proximity pilot (PP) signal, and in the GB standard, the plug status signal is also referred to as a connection confirm (CC) function signal.

In the three standards, because an interface configuration between an electric vehicle and a charging pile in the GB standard and the EU standard is similar, a plug status can be detected by using a same plug status detection circuit. However, because the interface configuration in the US standard is quite different from that in the other two standards (the GB standard and the EU standard), the plug status cannot be detected by using the same plug status detection circuit.

In the GB standard, a schematic diagram of an interface between a charging plug (namely, a plug) on the charging pile and a charging socket (referred to as a socket) on the electric vehicle may be shown in FIG. 1. After the plug is inserted into the socket, a CC detection circuit on the electric vehicle may determine a plug status by detecting a resistance value of an RC resistor (the resistance value of the RC resistor is calculated by detecting a voltage of a CC detection point). In the US standard, the schematic diagram of the interface between the plug and the socket may be shown in FIG. 2. After the plug is inserted into the socket, the CC detection circuit may determine the plug status by detecting the voltage of the CC detection point. By comparing FIG. 1 and FIG. 2, it can be learned that the socket in the US standard has an additional resistor R5 compared with that in the GB standard. In addition, in the GB standard, values of U and R are not mandatory, while in the US standard, values of U, R4, R5, R6, and R7 are all fixed.

Because the interface configuration is different in a different standard, the plug status in the three standards cannot be detected by using a same plug status detection circuit.

In the current technology, to enable detections of the GB standard, the EU standard, and the US standard to be compatible, the following solution is usually used: The plug status detection circuit supports the detection of the GB standard/EU standard by default, and a conversion module is configured for the plug status detection circuit to support the detection of the US standard, as shown in FIG. 3. When plug status detection is performed, whether a conversion module is needed to perform conversion is determined based on a system configuration.

In the solution provided by the current technology, when plug status detection is performed, the conversion module needs to be configured and different paths need to be selected based on a scenario. This increases a quantity of products configured on an electric vehicle side and is not conducive to normalized design and supply of a product.

SUMMARY

Embodiments of this application provide a plug status detection circuit, a controller, and a vehicle, to detect a plug status in different standards by using one detection circuit.

According to a first aspect, an embodiment of this application provides a plug status detection circuit. The plug status detection circuit includes a wake-up circuit and a sampling circuit. The wake-up circuit is configured to immediately output or delay outputting a wake-up signal based on a resistance value of a connected resistor of the plug status detection circuit when a plug is connected to a socket, where the wake-up signal is used to trigger a central processing unit (CPU) to drive the sampling circuit. The sampling circuit is configured to inject a startup voltage under the drive of the CPU, and after the startup voltage is injected, a level of a detection point of the sampling circuit is used to indicate a plug status.

The plug status detection circuit provided in the first aspect is used, and resistance value ranges of different connected resistors are distinguished by immediately outputting or delaying outputting a wake-up signal. No matter a GB standard plug, an EU standard plug, or a US standard plug is inserted into the socket, the wake-up circuit may be triggered to output the wake-up signal, so as to trigger the CPU to drive the sampling circuit to inject a startup voltage, and then start plug status detection. Compared with a solution provided in the current technology, in the foregoing solution, a plug status can be detected under different standards by using one plug status detection circuit, which reduces a quantity of products configured on an electric vehicle side and facilitates normalized design and supply of a product.

In addition, the wake-up signal is further used to trigger the CPU to collect the level of the detection point.

In the foregoing solution, after collecting the level of the detection point, the CPU can determine a plug status based on the level of the detection point.

In one embodiment, the wake-up circuit is further configured to disconnect from the detection point under the control of the CPU after outputting the wake-up signal.

In the foregoing solution, after the wake-up circuit outputs the wake-up signal, a function of the wake-up circuit is completed. In this case, the wake-up circuit is disconnected from the detection point, to reduce system power consumption.

In one embodiment, the wake-up circuit includes: a wake-up function enabling circuit, configured to communicate the detection point with the wake-up circuit when the plug is connected to the socket; a delay circuit, configured to implement delayed conduction of a switching transistor; a trigger level conversion circuit, configured to trigger a wake-up signal output circuit to output the wake-up signal when the resistance value of the connected resistor of the plug status detection circuit is less than a first resistance value and the switching transistor in the delay circuit is switched off, and trigger the wake-up signal output circuit to output the wake-up signal when the resistance value of the connected resistor of the plug status detection circuit is greater than a second resistance value and the switching transistor in the delay circuit is switched on; and the wake-up signal output circuit, configured to output the wake-up signal under the trigger of the trigger level conversion circuit.

Further, the wake-up function enabling circuit is further configured to disconnect the detection point from the wake-up circuit under the control of the CPU after the wake-up signal output circuit outputs the wake-up signal.

As described above, after outputting the wake-up signal, the wake-up circuit may further disconnect from the detection point under the control of the CPU. In the foregoing solution, this function can be implemented by the wake-up function enabling circuit.

In one embodiment, the sampling circuit includes: a first switching transistor, where a first terminal of the first switching transistor is configured to input the startup voltage, and a second terminal of the first switching transistor is coupled to the CPU; and a first resistor, where a first terminal of the first resistor is coupled to a third terminal of the first switching transistor, and a second terminal of the first resistor is coupled to the detection point.

The first switching transistor may be an NPN type triode, an NMOS, or another device having a similar function, and the first switching transistor is switched on when a voltage of the second terminal is a particular value higher than a voltage of the third terminal. The second terminal of the first switching transistor is a control terminal, and may be, for example, a base of the NPN type triode or a gate of the NMOS. The second terminal of the first switching transistor is coupled to the CPU, and the first switching transistor is switched off or on under the control of the CPU.

In one embodiment, the wake-up function enabling circuit includes: a second switching transistor, where a first terminal of the second switching transistor is coupled to the delay circuit and the trigger level conversion circuit, a second terminal of the second switching transistor is coupled to a first terminal of a third switching transistor, and a third terminal of the second switching transistor is coupled to the detection point; the third switching transistor, where a second terminal of the third switching transistor is coupled to the CPU, and a third terminal of the third switching transistor is grounded; and a second resistor, where a first terminal of the second resistor is coupled to the first terminal of the second switching transistor, and a second terminal of the second resistor is coupled to the first terminal of the third switching transistor.

The second switching transistor and the third switching transistor may be NPN type triodes, NMOSs, or other devices having similar functions. When a voltage of the second terminal is a particular value higher than a voltage of the third terminal, the second switching transistor is switched on, and the third switching transistor is switched on under a same condition. The second terminal of the second switching transistor and the second terminal of the third switching transistor are control terminals, and may be, for example, bases of the NPN type triodes or gates of the NMOSs.

In the foregoing solution, after the plug is inserted into the socket, the detection point is grounded. For the second switching transistor, the voltage of the third terminal is reduced, so that a voltage difference between the second terminal and the third terminal meets a switch-on condition of the second switching transistor. After the second switching transistor is switched on, the wake-up circuit is communicated with the detection point.

In one embodiment, the delay circuit includes: a third resistor, where a first terminal of the third resistor is coupled to the trigger level conversion circuit, and a second terminal of the third resistor is coupled to a first terminal of a first capacitor; the first capacitor, where a second terminal of the first capacitor is coupled to the first terminal of the second switching transistor; a fourth switching transistor, where a first terminal of the fourth switching transistor is coupled to the first terminal of the third resistor, a second terminal of the fourth switching transistor is coupled to the second terminal of the third resistor, and a third terminal of the fourth switching transistor is coupled to the second terminal of the first capacitor; and a second capacitor, where a first terminal of the second capacitor is coupled to the second terminal of the first capacitor, and a second terminal of the second capacitor is coupled to the trigger level conversion circuit.

The fourth switching transistor may be an NPN type triode, an NMOS, or another device having a similar function. When a voltage of the second terminal is a particular value higher than a voltage of the third terminal, the fourth switching transistor is switched on. The second terminal of the fourth switching transistor is a control terminal, and may be, for example, a base of the NPN type triode or a gate of the NMOS.

In the foregoing solution, both terminals of the first capacitor are bridged to the second terminal and the third terminal of the fourth switching transistor. As described above, after the plug is inserted into the socket, the first capacitor in the delay circuit starts charging, and the fourth switching transistor is switched off. After the charging is performed for a period of time, a voltage difference between the second terminal and the third terminal of the fourth switching transistor meets a switch-on condition of the fourth switching transistor, the fourth switching transistor is switched on, the charging of the first capacitor is completed, and the first capacitor is shorted. Through delay conduction of the fourth switching transistor, the delay circuit can implement a delayed output of the wake-up signal.

In one embodiment, the trigger level conversion circuit includes: a fourth resistor, where a first terminal of the fourth resistor is configured to receive an input voltage of the wake-up circuit, and a second terminal of the fourth resistor is coupled to the second terminal of the second capacitor; a fifth resistor, where a first terminal of the fifth resistor is configured to receive the input voltage of the wake-up circuit, and a second terminal of the fifth resistor is coupled to the first terminal of the second resistor; a sixth resistor, where a first terminal of the sixth resistor is coupled to the second terminal of the fourth resistor, and a second terminal of the third resistor is grounded; and a fifth switching transistor, where a first terminal of the fifth switching transistor is coupled to the wake-up signal output circuit, a second terminal of the fifth switching transistor is coupled to the second terminal of the fourth resistor, and a third terminal of the fifth switching transistor is coupled to the first terminal of the second switching transistor.

The fifth switching transistor may be an NPN type triode, an NMOS, or another device having a similar function. When a voltage of the second terminal is a particular value higher than a voltage of the third terminal, the fifth switching transistor is switched on. The second terminal of the fifth switching transistor is a control terminal, and may be, for example, a base of the NPN type triode or a gate of the NMOS.

In one embodiment, the wake-up signal output circuit includes: a seventh resistor, where a first terminal of the seventh resistor is configured to receive the input voltage of the wake-up circuit; an eighth resistor, where a first terminal of the eighth resistor is coupled to a second terminal of the seventh resistor, and a second terminal of the eighth resistor is coupled to the first terminal of the fifth switching transistor; and a sixth switching transistor, where a first terminal of the sixth switching transistor outputs the wake-up signal when the sixth switching transistor is switched on, a second terminal of the sixth switching transistor is coupled to the second terminal of the seventh resistor, and a third terminal of the sixth switching transistor is coupled to the first terminal of the seventh resistor.

In the foregoing solution, after the plug is inserted into the socket, the second switching transistor in the wake-up function enabling circuit is switched on, and the wake-up circuit is communicated with the detection point. The fourth switching transistor in the delay circuit is an NPN type triode or an NMOS. In this case, the voltage difference between the second terminal and the third terminal of the fourth switching transistor can hardly meet the switch-on condition of the fourth switching transistor, and the fourth switching transistor is switched off. The fourth resistor in the trigger level conversion circuit is connected to the circuit, and the first capacitor is charged through a path of the fifth resistor→the third resistor→the first capacitor→R5. As the charging process of the first capacitor proceeds, the voltage difference between the second terminal and the third terminal of the fourth switching transistor becomes larger, and when the voltage difference meets the switch-on condition of the fourth switching transistor, the fourth switching transistor is switched on, the third resistor and the first capacitor are shorted, and the first capacitor stops charging.

In this way, in three scenarios of a US standard, a closed GB standard S3, and an EU standard, the resistance value of the connected resistor of the plug status detection circuit is less than the first resistance value, and when the fourth switching transistor is switched off, the resistance value of the connected resistor can trigger the fifth switching transistor to switch on. After the fifth switching transistor is switched on, the trigger level conversion circuit can drive the wake-up signal output circuit to output the wake-up signal.

In a scenario of an unclosed GB standard S3, the resistance value of the connected resistor of the plug status detection circuit is greater than the second resistance value, and when the fourth switching transistor is switched off, the resistance value of the connected resistor cannot trigger the fifth switching transistor to switch on. As the charging process of the first capacitor proceeds, the voltage of the second terminal of the fourth switching transistor gradually increases until the fourth switching transistor is switched on. After the fourth switching transistor is switched on, the third resistor and the first capacitor are shorted. In this case, a connection relationship inside the plug status detection circuit changes, a resistance value inside the plug status detection circuit also changes, and the resistance value of the connected resistor of the plug status detection circuit can trigger the fifth switching transistor to switch on. After the fifth switching transistor is switched on, the trigger level conversion circuit can drive the wake-up signal output circuit to output the wake-up signal.

In addition, the wake-up signal output circuit further includes a third capacitor, where a first terminal of the third capacitor is coupled to the first terminal of the sixth switching transistor, and a second terminal of the third capacitor is configured to output the wake-up signal.

In the foregoing solution, the wake-up signal is a pulse signal, and in one embodiment, an output of the wake-up circuit is at a low level before the sixth switching transistor is switched on, and the wake-up circuit outputs a pulse signal after the sixth switching transistor is switched on. The pulse signal received by the CPU is considered as the wake-up signal.

According to a second aspect, an embodiment of this application further provides a plug status detection circuit. The plug status detection circuit includes: a first resistor, where a first terminal of the first resistor is configured to inject a startup voltage, and after the startup voltage is injected, a level of a detection point of the plug status detection circuit is used to indicate a plug status; a second resistor, where a first terminal of the second resistor is coupled to a second terminal of the first resistor, and a second terminal of the second resistor is coupled to the detection point; and a switching transistor, where a first terminal of the switching transistor outputs a wake-up signal when the switching transistor is switched on, a second terminal of the switching transistor is coupled to the second terminal of the first resistor, a third terminal of the switching transistor is coupled to the first terminal of the first resistor, and the wake-up signal is used to trigger a CPU to collect the level of the detection point.

Resistance values of the first resistor and the second resistor meet the following conditions: The switching transistor is switched off when a plug is not connected to a socket, and the switching transistor is switched on when the plug is connected to the socket.

In the foregoing solution, under three standards, namely, a GB standard, an EU standard, and a US standard, the wake-up signal can be output after the plug is inserted into the socket. The CPU collects a voltage of the detection point after receiving the wake-up signal, to further determine plug status detection. In other words, by using the plug status detection circuit provided in this embodiment of this application, a plug status can be detected in different standards by using one detection circuit, thereby reducing a quantity of products configured on an electric vehicle side and facilitating normalized design and supply of a product.

In addition, the plug status detection circuit provided in the second aspect further includes a level conversion unit, configured to convert an output voltage of a power battery into the startup voltage and inject the startup voltage into the first terminal of the first resistor.

According to a third aspect, an embodiment of this application further provides a controller. The controller includes the plug status detection circuit provided in the first aspect, the second aspect, and any embodiment thereof.

According to a fourth aspect, an embodiment of this application further provides a vehicle. The vehicle includes a CPU and the controller provided in the third aspect.

In addition, for technical effects brought by any embodiment manner in the third aspect and any embodiment manner in the fourth aspect, refer to technical effects brought by different design manners in the first aspect and the second aspect, and details are not described herein again.

DESCRIPTION OF EMBODIMENTS

A plug status detection solution provided in the embodiments of this application is used to detect a plug status.

In one embodiment, the plug status may be a fully-connected state, a half-connected state, or an unconnected state. For example, in a GB standard, when a plug is inserted into a socket and S3 is not closed, the plug is a half-connected state; when the plug is inserted into the socket, and S3 is closed, the plug status is a fully-connected state; and when the plug is not inserted into the socket, the plug status is an unconnected state. In addition, in the GB standard and an EU standard, for the fully-connected state, different charging cable capacities may correspond to different plug states. For example, a fully-connected state and a charging cable current-carrying capacity of 10 A correspond to one plug status, and a fully-connected state and a charging cable current-carrying capacity of 32 A correspond to another plug status. A resistance value of an RC resistor varies with the plug status.

To make objectives, technical solutions, and advantages of this application more clearly, the following further describes this application in detail with reference to the accompanying drawings.

Figure 4:
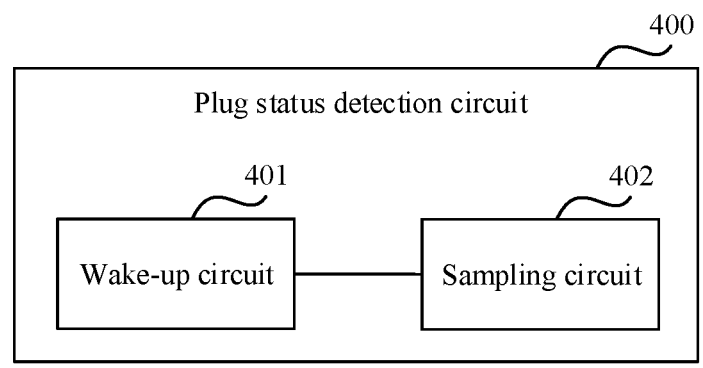
FIG. 4 is a schematic diagram of a structure of a first plug status detection circuit according to an embodiment of this application.

An embodiment of this application provides a plug status detection circuit. As shown in FIG. 4, the plug status detection circuit 400 includes a wake-up circuit 401 and a sampling circuit 402.

The wake-up circuit 401 is configured to immediately output or delay outputting a wake-up signal based on a resistance value of a connected resistor of the plug status detection circuit 400 when a plug is connected to a socket, where the wake-up signal is used to trigger a central processing unit (CPU) to drive the sampling circuit 402. The sampling circuit 402 is configured to inject a startup voltage under the drive of the CPU, and after the startup voltage is injected, a level of a detection point of the sampling circuit 402 is used to indicate a plug status.

It can be learned from the description of the background that interface configurations in the GB standard, the EU standard, and the US standard are different, and for a plug status detection circuit disposed on an electric vehicle, different interface configurations correspond to different connected resistors. For example, under the US standard, after the plug is inserted into the socket, a resistance value range of the plug status detection circuit is 100Ω to 1.5 kΩ. When a GB standard S3 is not closed, the resistance value of the connected resistor of the plug status detection circuit is 3.8 kΩ after the plug is inserted into the socket.

In this embodiment of this application, resistance value ranges of different connected resistors are distinguished by immediately outputting or delaying outputting the wake-up signal. No matter a GB standard plug, an EU standard plug, or a US standard plug is inserted into the socket, the wake-up circuit 401 may be triggered to output the wake-up signal, so as to trigger the CPU to drive the sampling circuit 402 to inject a startup voltage, and then start plug status detection.

For example, in three scenarios of the US standard, a closed GB standard S3, and the EU standard, after the plug is inserted into the socket, the resistance value range of the plug status detection circuit 400 is 100Ω to 1.5 kΩ, and in this case, the wake-up circuit 401 can immediately output the wake-up signal. For another example, in a scenario of an unclosed GB standard S3, after the plug is inserted into the socket, the resistance value of the connected resistor of the plug status detection circuit 400 is about 3.8 kΩ, and in this case, the wake-up circuit 401 may delay outputting the wake-up signal.

After receiving the wake-up signal output from the wake-up circuit 401, the CPU may drive the sampling circuit 402, so that the startup voltage is injected into the sampling circuit 402. After the startup voltage is injected, the level of the detection point of the sampling circuit 402 is used to indicate a plug status. The CPU may collect the level of the detection point, to further determine the plug status.

In this embodiment of this application, a particular manner in which the CPU determines the plug status may be as follows: When the plug is not inserted into the socket, the wake-up circuit 401 does not output the wake-up signal, and the CPU determines that the plug status is an unconnected state when the wake-up signal is not received; after the plug is inserted into the socket, the wake-up circuit 401 immediately outputs or delays outputting the wake-up signal when the resistance value of the connected resistor is different; and after receiving the wake-up signal, the CPU drives the sampling circuit 402 to inject a driving voltage, and determines the plug status by detecting a voltage of the detection point. When an S3 switch status is different and a cable current-carrying capacity is different, the voltage of the detection point detected by the CPU is different. Therefore, the CPU can determine the plug status based on the voltage of the detection point.

It is easy to learn that, in this embodiment of this application, under the US standard, the EU standard, and the GB standard, as long as the plug is inserted into the socket, the wake-up circuit 401 outputs (immediately or delays outputting) the wake-up signal. After receiving the wake-up signal, the CPU may drive the sampling circuit 402, and determine the plug status by collecting the voltage of the detection point in the sampling circuit 402. That is, the plug status detection circuit 400 provided in this embodiment of this application can be used to detect a plug status under different standards. Compared with a solution provided in the current technology, in this embodiment of this application, a plug status can be detected under different standards by using one plug status detection circuit 400, which reduces a quantity of products configured on an electric vehicle side and facilitates normalized design and supply of a product.

Figure 5:
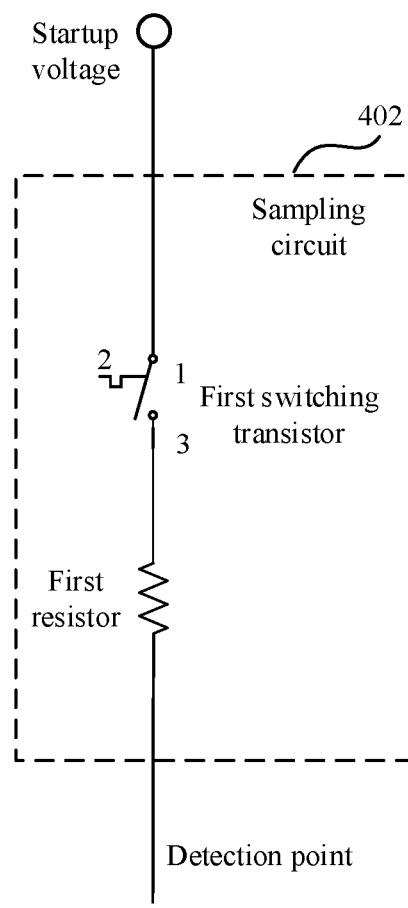
FIG. 5 is a schematic diagram of a structure of a sampling circuit according to an embodiment of this application.

In this embodiment of this application, the sampling circuit 402 may include a first switching transistor and a first resistor. A first terminal of the first switching transistor is configured to input the startup voltage, and a second terminal of the first switching transistor is coupled to the CPU; and a first terminal of the first resistor is coupled to a third terminal of the first switching transistor, and a second terminal of the first resistor is coupled to the detection point, as shown in FIG. 5.

The first switching transistor may be an NPN type triode, an N type metal-oxide-semiconductor (N-metal-oxide-semiconductor, NMOS), or another device having a similar function, and the first switching transistor is switched on when a voltage of the second terminal is a particular value higher than a voltage of the third terminal. The second terminal of the first switching transistor is a control terminal, and may be, for example, a base of the NPN type triode or a gate of the NMOS. The second terminal of the first switching transistor is coupled to the CPU, and the first switching transistor is switched off or on under the control of the CPU.

After receiving the wake-up signal, the CPU may send a drive signal to the first switching transistor (for example, apply a 12 V level to the second terminal of the first switching transistor), so that the voltage of the second terminal of the first switching transistor increases to meet a conduction condition of the first switching transistor. After the first switching transistor is switched on, the startup voltage (for example, the startup voltage may be 5 V) is injected into the sampling circuit 402.

Figure 1:
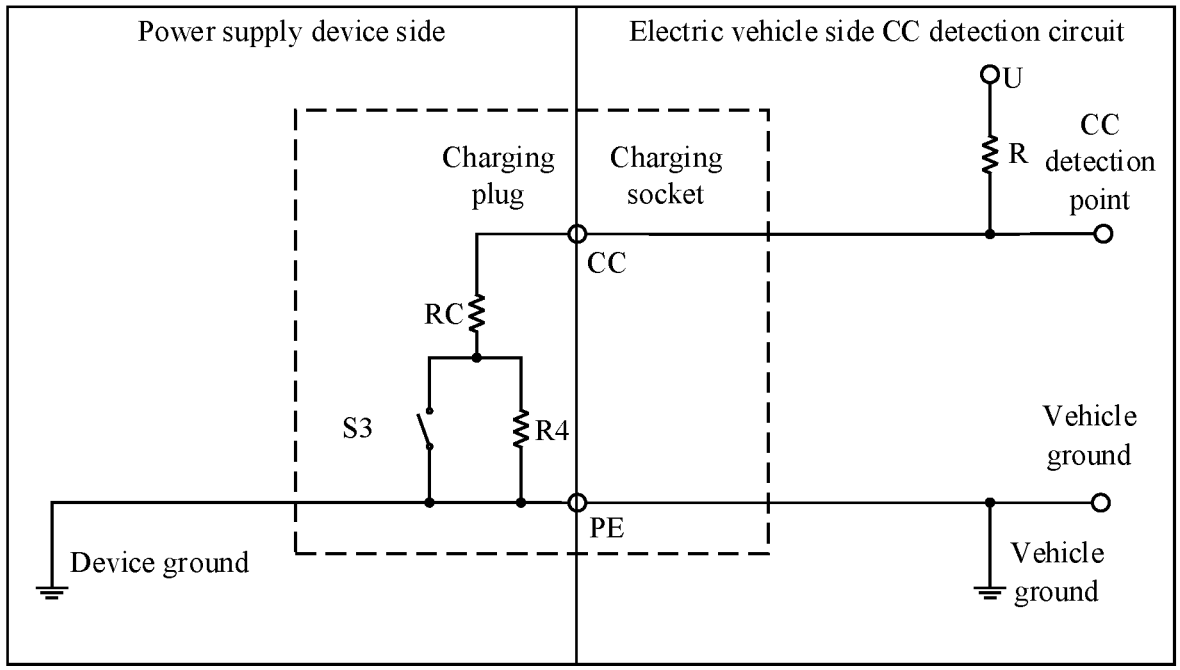
FIG. 1 is a schematic diagram of an interface between an electric vehicle and a charging pile in a GB standard according to the current technology.
Figure 2:
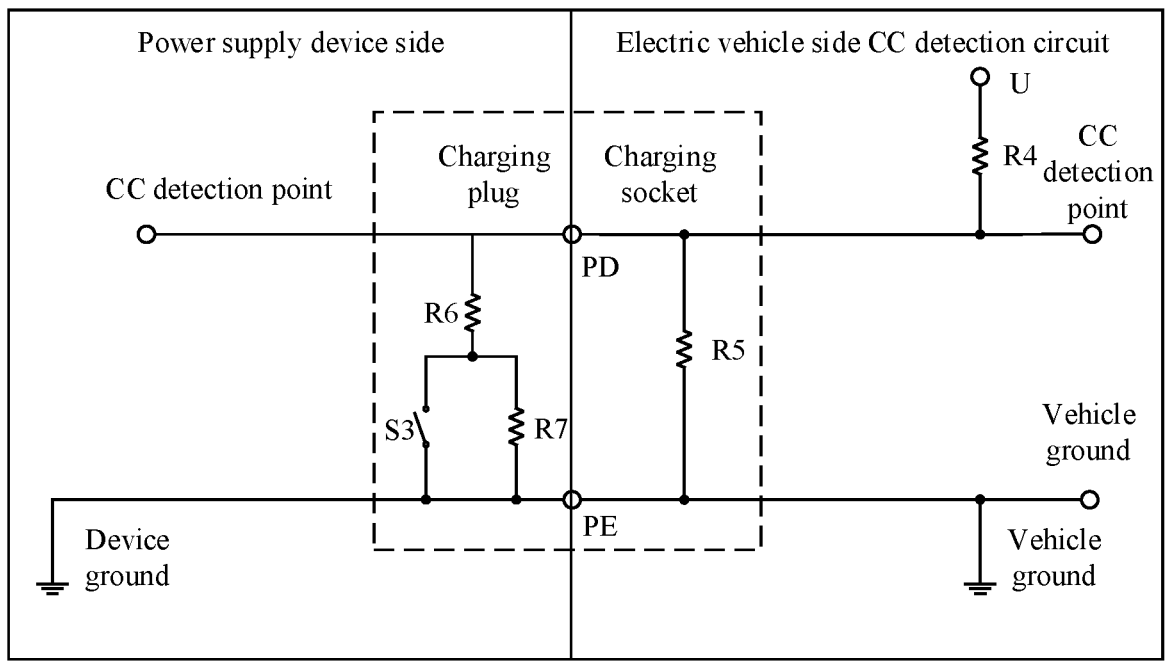
FIG. 2 is a schematic diagram of an interface between an electric vehicle and a charging pile in a US standard according to the current technology.
Figure 3:
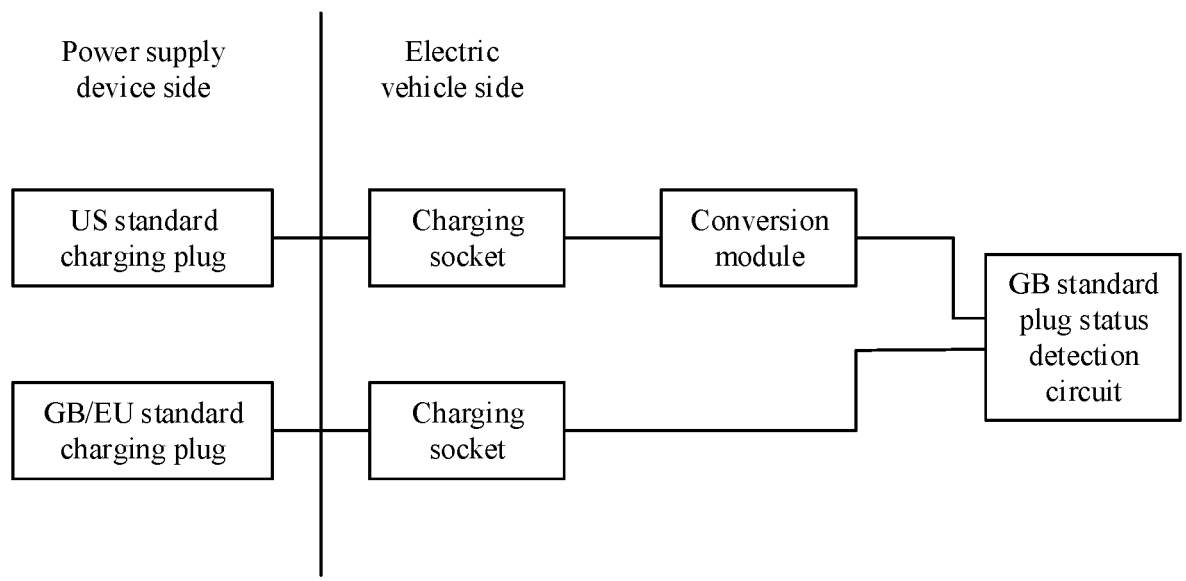
FIG. 3 is a schematic diagram of a structure of a plug status detection circuit according to the current technology.

The sampling circuit 402 provided in this embodiment of this application and a CC detection circuit provided in the current technology (for example, as shown in FIG. 1 or FIG. 2) have similar functions and structures. A difference is that the first switching transistor is disposed in the sampling circuit 402. After the plug is inserted into the socket, the wake-up circuit 401 outputs the wake-up signal, and the CPU drives the sampling circuit 402 through the first switching transistor after receiving the wake-up signal. In one embodiment, the first switching transistor is disposed in the sampling circuit 402, so that the startup voltage is not injected into the sampling circuit 402 when the plug is not inserted into the socket, that is, the sampling circuit 402 does not work, to reduce quiescent current and system power consumption.

It should be noted that in this embodiment of this application, positions of the first switching transistor and the first resistor are interchangeable (the second terminal of the first switching transistor is still coupled to the CPU), for example, the first terminal of the first resistor is configured to input the startup voltage, and the first terminal and the third terminal of the first switching transistor are respectively coupled to the second terminal of the first resistor and the detection point. The interchange of the positions of the first switching transistor and the first resistor has no substantial effect on implementation of a function of the sampling circuit 402.

In this embodiment of this application, the wake-up circuit 401 is further configured to disconnect from the detection point under the control of the CPU after outputting the wake-up signal.

After the wake-up circuit 401 outputs the wake-up signal, a function of the wake-up circuit 401 is completed. In this case, the wake-up circuit 401 may be disconnected from the detection point, to reduce the system power consumption.

In one embodiment, the wake-up circuit 401 may include a wake-up function enabling circuit, a delay circuit, a trigger level conversion circuit, and a wake-up signal output circuit. The wake-up function enabling circuit is configured to communicate the detection point with the wake-up circuit 401 when the plug is connected to the socket; the delay circuit is configured to implement delayed conduction of a switching transistor; the trigger level conversion circuit is configured to trigger the wake-up signal output circuit to output the wake-up signal when the resistance value of the connected resistor of the plug status detection circuit 400 is less than a first resistance value and the switching transistor in the delay circuit is switched off, and trigger the wake-up signal output circuit to output the wake-up signal when the resistance value of the connected resistor of the plug status detection circuit 400 is greater than a second resistance value and the switching transistor in the delay circuit is switched on; and the wake-up signal output circuit is configured to output the wake-up signal under the trigger of the trigger level conversion circuit.

The delay circuit implements delaying outputting the wake-up signal through the delayed conduction of the switching transistor. The delay circuit may include the switching transistor and a capacitor. Both terminals of the capacitor are bridged to a second terminal and a third terminal of the switching transistor. After the plug is inserted into the socket, the capacitor in the delay circuit starts charging, and the switching transistor is switched off. After the charging is performed for a period of time, a voltage difference between the second terminal and the third terminal of the switching transistor meets a switch-on condition of the switching transistor, the switching transistor is switched on, the charging of the capacitor is completed, and the capacitor is shorted. The switch-off state and the switch-on state of the switching transistor in the delay circuit respectively correspond to two connection states in the plug status detection circuit 400, and the two states may match different resistance values of the connected resistor of the plug status detection circuit 400. Therefore, when the plug is inserted into the socket, the wake-up circuit 401 may output the wake-up signal under the US standard, the EU standard, and the GB standard (a different standard corresponds to a different resistance value range of the connected resistor).

For example, in the three scenarios of the US standard, the closed GB standard S3, and the EU standard, after the plug is inserted into the socket, the resistance value range of the connected resistor of the plug status detection circuit 400 is 100Ω to 1.5 kΩ, and when the switching transistor in the delay circuit is switched off (that is, when the capacitor starts charging), a connection status inside the plug status detection circuit 400 can trigger the wake-up circuit 401 to output the wake-up signal, that is, the wake-up signal is output immediately after the plug is inserted into the socket. For another example, in the scenario of the unclosed GB standard S3, after the plug is inserted into the socket, the resistance value of the connected resistor of the plug status detection circuit 400 is about 3.8 kΩ. When the switching transistor in the delay circuit is switched off (that is, when the capacitor is charged), the connection status inside the plug status detection circuit 400 does not trigger the wake-up circuit 401 to output the wake-up signal; and only when the switching transistor in the delay circuit is switched on (that is, when the charging of the capacitor is completed), the connection status inside the plug status detection circuit 400 can trigger the wake-up circuit 401 to output the wake-up signal, that is, the output of the wake-up signal is delayed after the plug is inserted into the socket.

In addition, as described above, after outputting the wake-up signal, the wake-up circuit 401 may further disconnect from the detection point under the control of the CPU. In one embodiment, this function may be implemented by the wake-up function enabling circuit, and in one embodiment, the wake-up function enabling circuit is further configured to disconnect the detection point from the wake-up circuit 401 under the control of the CPU after the wake-up circuit 401 outputs the wake-up signal.

Functions of the wake-up function enabling circuit, the delay circuit, the trigger level conversion circuit, and the wake-up signal output circuit are described above. Particular structures of the wake-up function enabling circuit, the delay circuit, the trigger level conversion circuit, and the wake-up signal output circuit are described below.

1. Wake-Up Function Enabling Circuit

Figure 6:
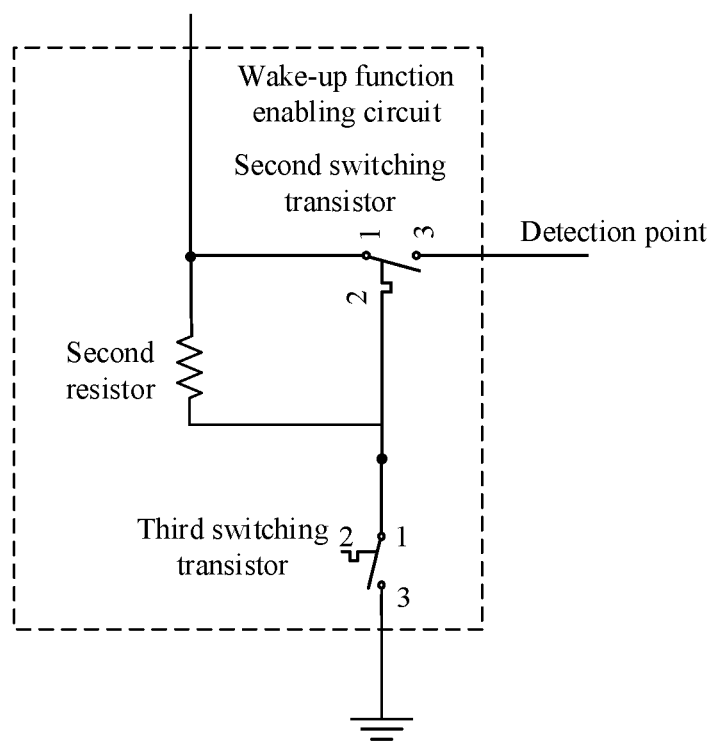
FIG. 6 is a schematic diagram of a structure of a wake-up function enabling circuit according to an embodiment of this application.

In this embodiment of this application, the wake-up function enabling circuit includes a second switching transistor, a third switching transistor, and a second resistor. In one embodiment, a first terminal of the second switching transistor is coupled to the delay circuit and the trigger level conversion circuit, a second terminal of the second switching transistor is coupled to a first terminal of the third switching transistor, and a third terminal of the second switching transistor is coupled to the detection point; a second terminal of the third switching transistor is coupled to the CPU, and a third terminal of the third switching transistor is grounded; and a first terminal of the second resistor is coupled to the first terminal of the second switching transistor, and a second terminal of the second resistor is coupled to the first terminal of the third switching transistor, as shown in FIG. 6.

The second switching transistor and the third switching transistor may be NPN type triodes, NMOSs, or other devices having similar functions. When a voltage of the second terminal is a particular value higher than a voltage of the third terminal, the second switching transistor is switched on, and the third switching transistor is switched on under a same condition. The second terminal of the second switching transistor and the second terminal of the third switching transistor are control terminals, and may be, for example, bases of the NPN type triodes or gates of the NMOSs.

The second terminal of the third switching transistor is coupled to the CPU, and the third switching transistor is switched off or on under the control of the CPU. Before receiving the wake-up signal, the CPU controls the third switching transistor to be switched off (that is, sets a low level for driving the third switching transistor), and in this case, the wake-up circuit 401 works normally; after receiving the wake-up signal, the CPU controls the third switching transistor to switch on (that is, sets a high level for driving the third switching transistor), and in this case, the wake-up circuit 401 is disconnected with the detection point, and the wake-up circuit 401 no longer works, that is, as described above, the wake-up function enabling circuit is further configured to disconnect the detection point from the wake-up circuit 401 under the control of the CPU after the wake-up circuit 401 outputs the wake-up signal.

Figure 7:
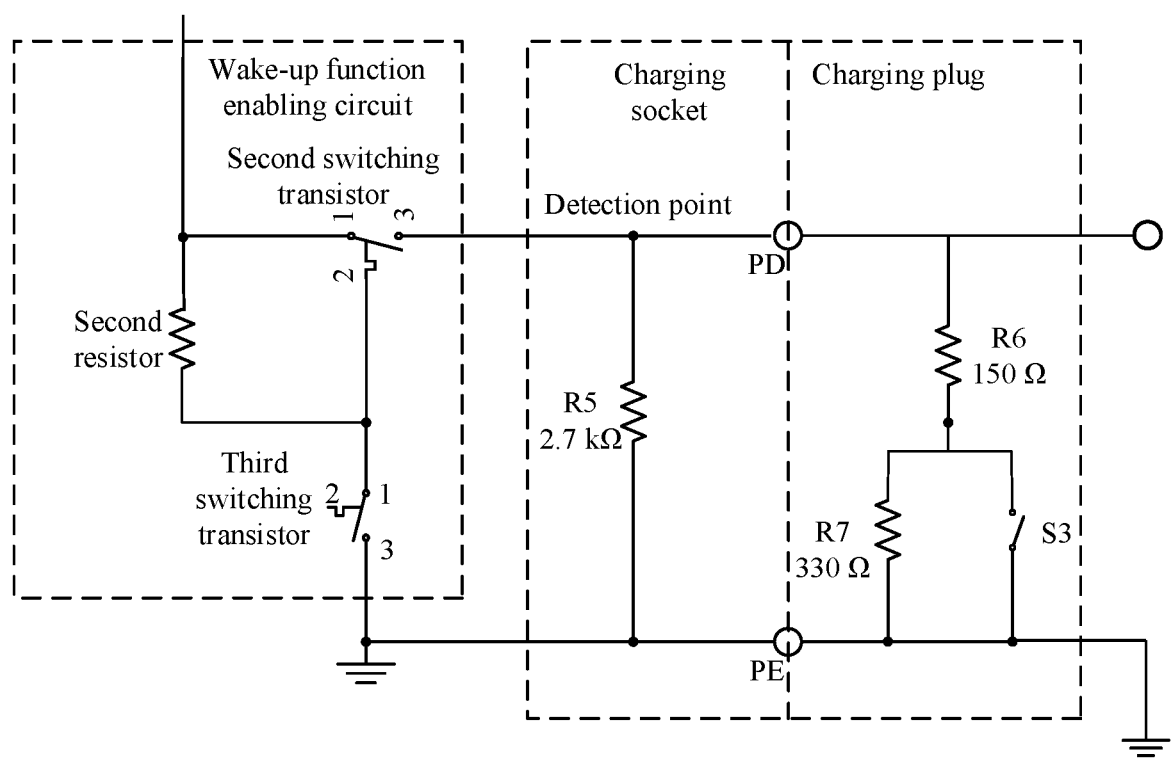
FIG. 7 is a schematic diagram of connection of a wake-up function enabling circuit with a socket and a plug according to an embodiment of this application.

A working principle of the wake-up function enabling circuit when the third switching transistor switched off (that is, the CPU does not receive the wake-up signal) is analyzed below. To facilitate analysis, the wake-up function enabling circuit and an interface configuration structure are shown in a figure, and a US standard interface is used as an example (in a following figure of this embodiment of this application, the US standard interface is also used as an example, and details are not described later). A connection relationship of the wake-up function enabling circuit with the plug and the socket may be shown in FIG. 7. After the plug is inserted into the socket, the detection point is grounded through R5. For the second switching transistor, the voltage of the third terminal is reduced, so that a voltage difference between the second terminal and the third terminal meets a switch-on condition of the second switching transistor. After the second switching transistor is switched on, the wake-up circuit 401 is communicated with the detection point.

2. Delay Circuit

In this embodiment of this application, the delay circuit includes a third resistor, a first capacitor, a fourth switching transistor, and a second capacitor. A first terminal of the third resistor is coupled to the trigger level conversion circuit, and a second terminal of the third resistor is coupled to a first terminal of the first capacitor; a second terminal of the first capacitor is coupled to the first terminal of the second switching transistor; a first terminal of the fourth switching transistor is coupled to the first terminal of the third resistor, a second terminal of the fourth switching transistor is coupled to the second terminal of the third resistor, and a third terminal of the fourth switching transistor is coupled to the second terminal of the first capacitor; and a first terminal of the second capacitor is coupled to the second terminal of the first capacitor, and a second terminal of the second capacitor is coupled to the trigger level conversion circuit.

The fourth switching transistor may be an NPN type triode, an NMOS, or another device having a similar function. When a voltage of the second terminal is a particular value higher than a voltage of the third terminal, the fourth switching transistor is switched on. The second terminal of the fourth switching transistor is a control terminal, and may be, for example, a base of the NPN type triode or a gate of the NMOS.

Both terminals of the first capacitor are bridged to the second terminal and the third terminal of the fourth switching transistor. As described above, after the plug is inserted into the socket, the first capacitor in the delay circuit starts charging, and the fourth switching transistor is switched off. After the charging is performed for a period of time, a voltage difference between the second terminal and the third terminal of the fourth switching transistor meets a switch-on condition of the fourth switching transistor, the fourth switching transistor is switched on, the charging of the first capacitor is completed, and the first capacitor is shorted. Through delay conduction of the fourth switching transistor, the delay circuit can implement a delayed output of the wake-up signal.

Because the delay circuit works in conjunction with the trigger level conversion circuit, a particular function of the delay circuit is subsequently described together with the trigger level conversion circuit.

3. Trigger Level Conversion Circuit

In this embodiment of this application, the trigger level conversion circuit includes a fourth resistor, a fifth resistor, a sixth resistor, and a fifth switching transistor. A first terminal of the fourth resistor is configured to receive an input voltage of the wake-up circuit 401, and a second terminal of the fourth resistor is coupled to the second terminal of the second capacitor; a first terminal of the fifth resistor is configured to receive an input voltage (for example, the input voltage may be 12 V) of the wake-up circuit 401, and a second terminal of the fifth resistor is coupled to the first terminal of the second resistor; a first terminal of the sixth resistor is coupled to the second terminal of the fourth resistor, and a second terminal of the third resistor is grounded; and a first terminal of the fifth switching transistor is coupled to the wake-up signal output circuit, a second terminal of the fifth switching transistor is coupled to the second terminal of the fourth resistor, and a third terminal of the fifth switching transistor is coupled to the first terminal of the second switching transistor.

The fifth switching transistor may be an NPN type triode, an NMOS, or another device having a similar function. When a voltage of the second terminal is a particular value higher than a voltage of the third terminal, the fifth switching transistor is switched on. The second terminal of the fifth switching transistor is a control terminal, and may be, for example, a base of the NPN type triode or a gate of the NMOS.

Figure 8:
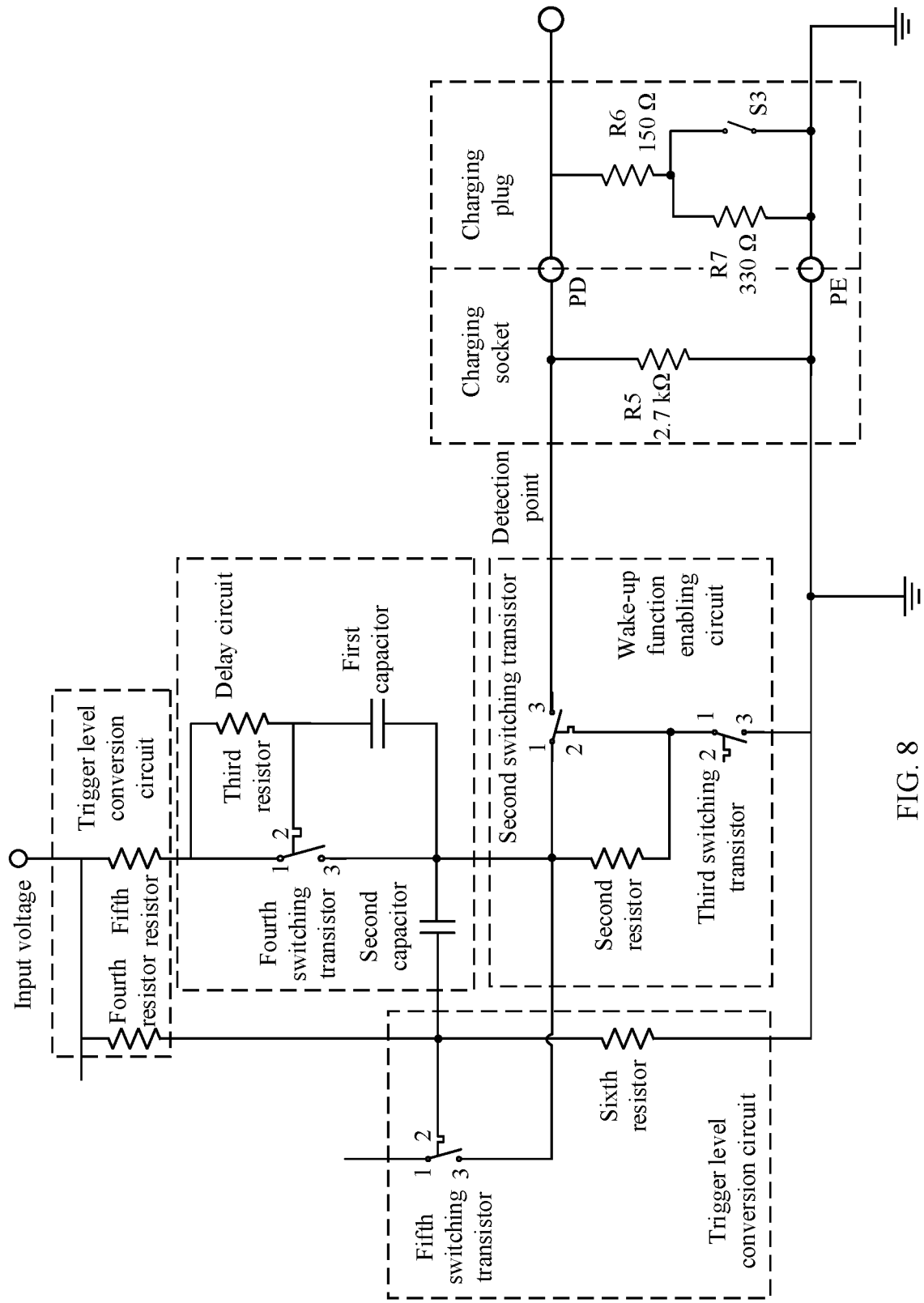
FIG. 8 is a schematic diagram of structures of a delay circuit and a trigger level conversion circuit according to an embodiment of this application.

A schematic diagram of structures of the delay circuit and the trigger level conversion circuit may be shown in FIG. 8.

A working principle of the delay circuit and the trigger level conversion circuit is analyzed as follows: After the plug is inserted into the socket, the second switching transistor in the wake-up function enabling circuit is switched on, and the wake-up circuit 401 is communicated with the detection point. The fourth switching transistor in the delay circuit is an NPN type triode or an NMOS. In this case, the voltage difference between the second terminal and the third terminal of the fourth switching transistor can hardly meet the switch-on condition of the fourth switching transistor, and the fourth switching transistor is switched off. The fourth resistor in the trigger level conversion circuit is connected to the circuit, and the first capacitor is charged through a path of the fifth resistor→the third resistor→the first capacitor→R5. As the charging process of the first capacitor proceeds, the voltage difference between the second terminal and the third terminal of the fourth switching transistor becomes larger, and when the voltage difference meets the switch-on condition of the fourth switching transistor, the fourth switching transistor is switched on, the third resistor and the first capacitor are shorted, and the first capacitor stops charging.

In the three scenarios of the US standard, the closed GB standard S3, and the EU standard, the resistance value of the connected resistor of the plug status detection circuit 400 is less than the first resistance value (for example, the resistance value may be 1.5 kΩ), and when the fourth switching transistor is switched off, the resistance value of the connected resistor can trigger the fifth switching transistor to switch on. After the fifth switching transistor is switched on, the trigger level conversion circuit can drive the wake-up signal output circuit to output the wake-up signal.

In the scenario of the unclosed GB standard S3, the resistance value of the connected resistor of the plug status detection circuit 400 is greater than the second resistance value (for example, the resistance value may be 3.7 kΩ or 3.8 kΩ), and when the fourth switching transistor is switched off, the resistance value of the connected resistor cannot trigger the fifth switching transistor to switch on. As the charging process of the first capacitor proceeds, the voltage of the second terminal of the fourth switching transistor gradually increases until the fourth switching transistor is switched on. After the fourth switching transistor is switched on, the third resistor and the first capacitor are shorted. In this case, a connection relationship inside the plug status detection circuit 400 changes, a resistance value inside the plug status detection circuit also changes, and the resistance value of the connected resistor of the plug status detection circuit 400 can trigger the fifth switching transistor to switch on. After the fifth switching transistor is switched on, the trigger level conversion circuit can drive the wake-up signal output circuit to output the wake-up signal.

In the trigger level conversion circuit, the fifth switching transistor works in a saturation region, and when the plug is inserted into the socket, the fifth switching transistor is switched off after being momently switched on.

It is easy to learn that the wake-up circuit 401 immediately outputs the wake-up signal after the plug is inserted into the socket in the three scenarios of the US standard, the closed GB standard S3, and the EU standard; and the wake-up circuit 401 does not immediately output the wake-up signal, but outputs the wake-up signal after a delay of set duration after the plug is inserted into the socket in the scenario of the unclosed national standard S3. The set duration is charging duration of the first capacitor, and may be set by adjusting a capacitance value of the first capacitor, a resistance value of the third resistor, a resistance value of the fifth resistor, and the like.

4. Wake-Up Signal Output Circuit

Figure 9:
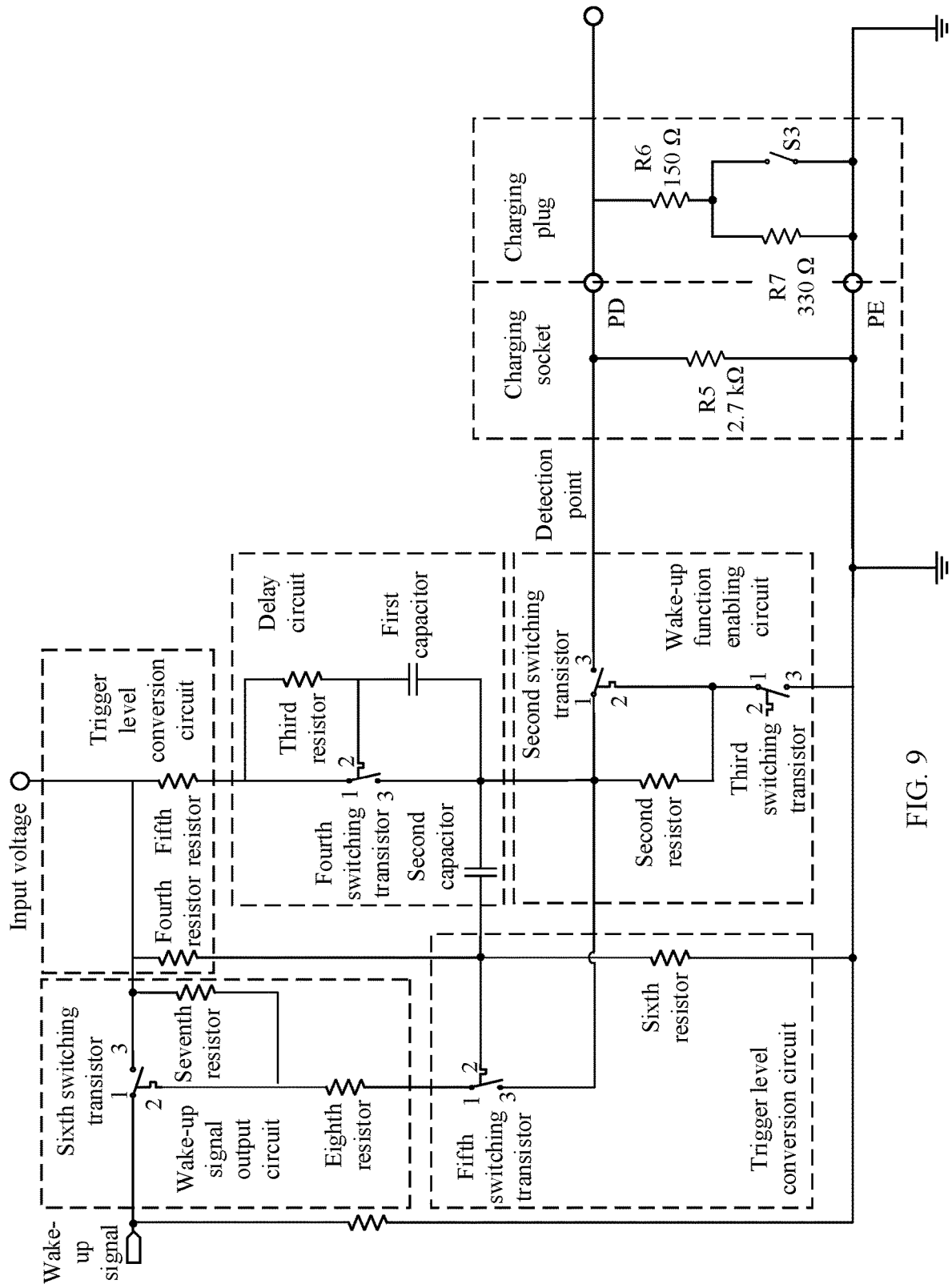
FIG. 9 is a schematic diagram of a structure of a wake-up signal output circuit according to an embodiment of this application.

In this embodiment of this application, the wake-up signal output circuit includes a seventh resistor, an eighth resistor, and a sixth switching transistor. A first terminal of the seventh resistor is configured to receive the input voltage of the wake-up circuit 401; a first terminal of the eighth resistor is coupled to a second terminal of the seventh resistor, and a second terminal of the eighth resistor is coupled to the first terminal of the fifth switching transistor; and a first terminal of the sixth switching transistor outputs the wake-up signal when the sixth switching transistor is switched on, a second terminal of the sixth switching transistor is coupled to the second terminal of the seventh resistor, and a third terminal of the sixth switching transistor is coupled to the first terminal of the seventh resistor, as shown in FIG. 9.

The sixth switching transistor is a PNP type triode, a P-metal-oxide-semiconductor (PMOS), or another device having a similar function, and when a voltage difference between the second terminal and the third terminal is less than a particular value, the sixth switching transistor is switched on. The second terminal of the sixth switching transistor is a control terminal, and may be, for example, a base of the PNP type triode or a gate of the PMOS.

After the fifth switching transistor in the trigger level conversion circuit is switched on, the second terminal of the sixth switching transistor is grounded through the eighth resistor and R5, so that the voltage difference between the second terminal and the third terminal is reduced, the sixth switching transistor is switched on, and the wake-up signal is output. The wake-up signal may be understood as a conversion from a low level to a high level. In one embodiment, an output of the wake-up circuit 401 is at a low level before the sixth switching transistor is switched on, and the output of the wake-up circuit 401 is at a high level after the sixth switching transistor is switched on. When the CPU captures an output jump of the wake-up circuit 401, it can be considered that the CPU receives the wake-up signal.

In addition, the wake-up signal output circuit may further include a third capacitor, where a first terminal of the third capacitor is coupled to the first terminal of the sixth switching transistor, and a second terminal of the third capacitor is configured to output the wake-up signal. In this case, the wake-up signal may be understood as a pulse signal. In one embodiment, the output of the wake-up circuit 401 is at a low level before the sixth switching transistor is switched on, and the wake-up circuit 401 outputs a pulse signal after the sixth switching transistor is switched on. The pulse signal received by the CPU is considered as the wake-up signal.

It can be learned from the above analysis that the wake-up circuit 401 provided in this embodiment of this application can output the wake-up signal after the plug is inserted into the socket under the three standards, namely, the GB standard, the EU standard, and the US standard, so that the CPU drives the sampling circuit 402 after receiving the wake-up signal, to further perform plug status detection. In other words, by using the plug status detection circuit 400 provided in this embodiment of this application, a plug status can be detected under different standards by using one detection circuit, thereby reducing a quantity of products configured on an electric vehicle side and facilitating normalized design and supply of a product. In addition, in this embodiment of this application, the startup voltage is not injected into the sampling circuit 402 when the plug is not inserted into the socket, and the sampling circuit is not in a working state, so that the system power consumption can be reduced, and the plug status detection circuit 400 can have low quiescent current.

Further, after the wake-up circuit 401 outputs the wake-up signal, the wake-up circuit 401 is disconnected from the detection point, so that the system power consumption may be further reduced, and the wake-up circuit 401 may not interfere with detection of the sampling circuit 402.

Figure 10:
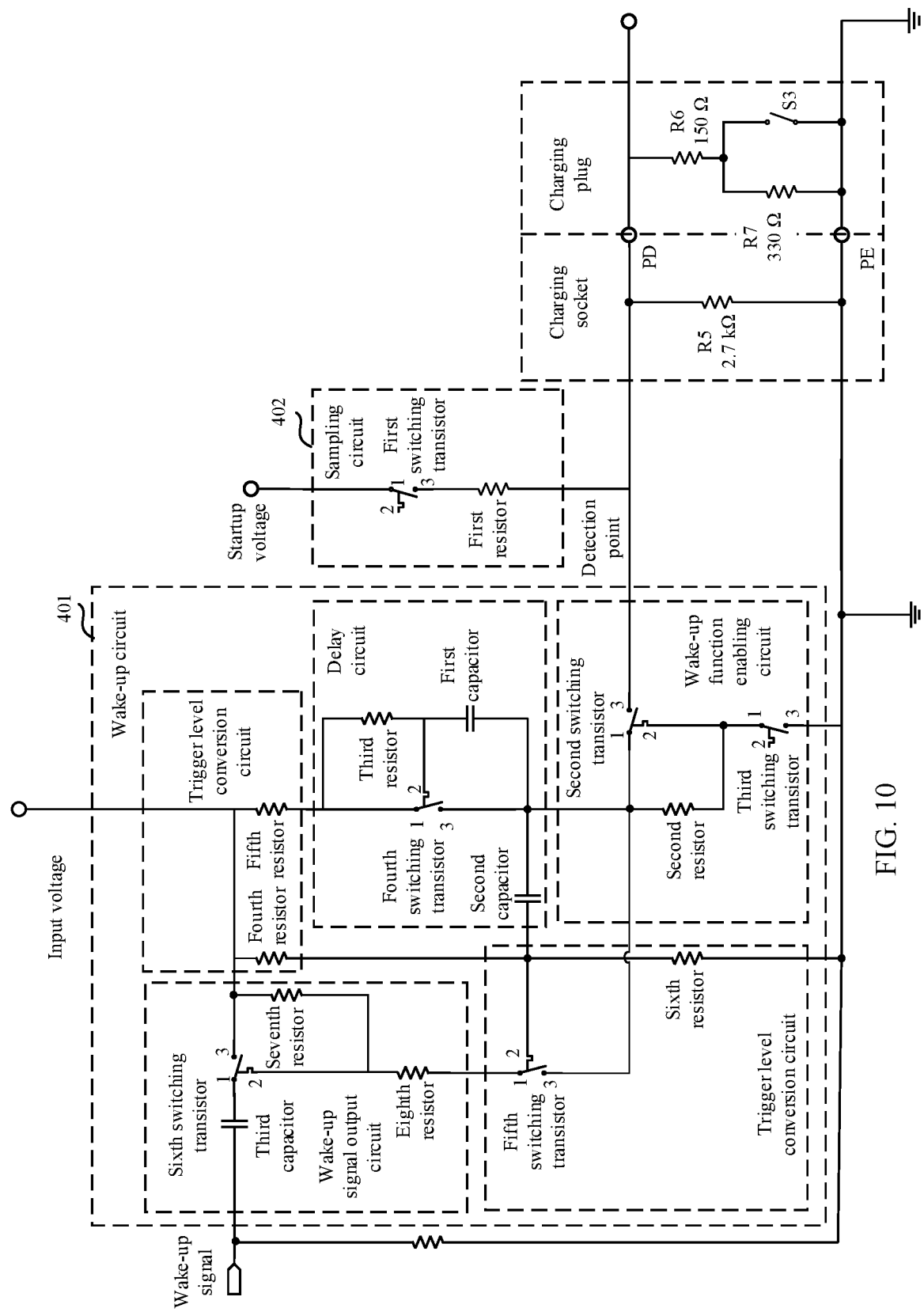
FIG. 10 is a schematic diagram of a structure of a second plug status detection circuit according to an embodiment of this application.

For example, FIG. 10 is a schematic diagram of a possible structure of the plug status detection circuit according to this embodiment of this application.

In the plug status detection circuit shown in FIG. 10, before the plug is inserted into the socket, the first switching transistor in the sampling circuit 402 is switched off, and the sampling circuit 402 does not work; and the second switching transistor in the wake-up circuit 401 is switched off, and the wake-up circuit 401 does not work. In this case, the system implements low quiescent current and low power consumption.

In the three scenarios of the US standard, the closed GB standard S3, and the EU standard, the first capacitor starts charging after the plug is inserted into the socket. Before the fourth switching transistor is switched on, the resistance value of the connected resistor of the plug status detection circuit can meet a switch-on condition of the fifth switching transistor, the fifth switching transistor is switched on, and the wake-up circuit 401 outputs the wake-up signal.

In the scenario of the unclosed GB standard S3, the first capacitor starts charging after the plug is inserted into the socket. Before the fourth switching transistor is switched on, the resistance value of the connected resistor of the plug status detection circuit cannot meet the switch-on condition of the fifth switching transistor, the fifth switching transistor is not switched on, and the wake-up circuit 401 does not output the wake-up signal. After the first capacitor is charged for set duration, the fourth switching transistor is switched on, and the third resistor is shorted. In this case, the resistance value of the connected resistor of the plug status detection circuit can meet the switch-on condition of the fifth switching transistor, the fifth switching transistor is switched on, and the wake-up circuit 401 outputs the wake-up signal.

Under any standard, after the wake-up circuit 401 outputs the wake-up signal to the CPU, the CPU controls the first switching transistor in the sampling circuit 402 to switch on, the startup voltage is injected into the sampling circuit 402, and the CPU starts plug status detection. In addition, the CPU sets a high level for driving the third switching transistor, the third switching transistor is switched on, and the wake-up circuit 401 is disconnected from the detection point.

Figure 11:
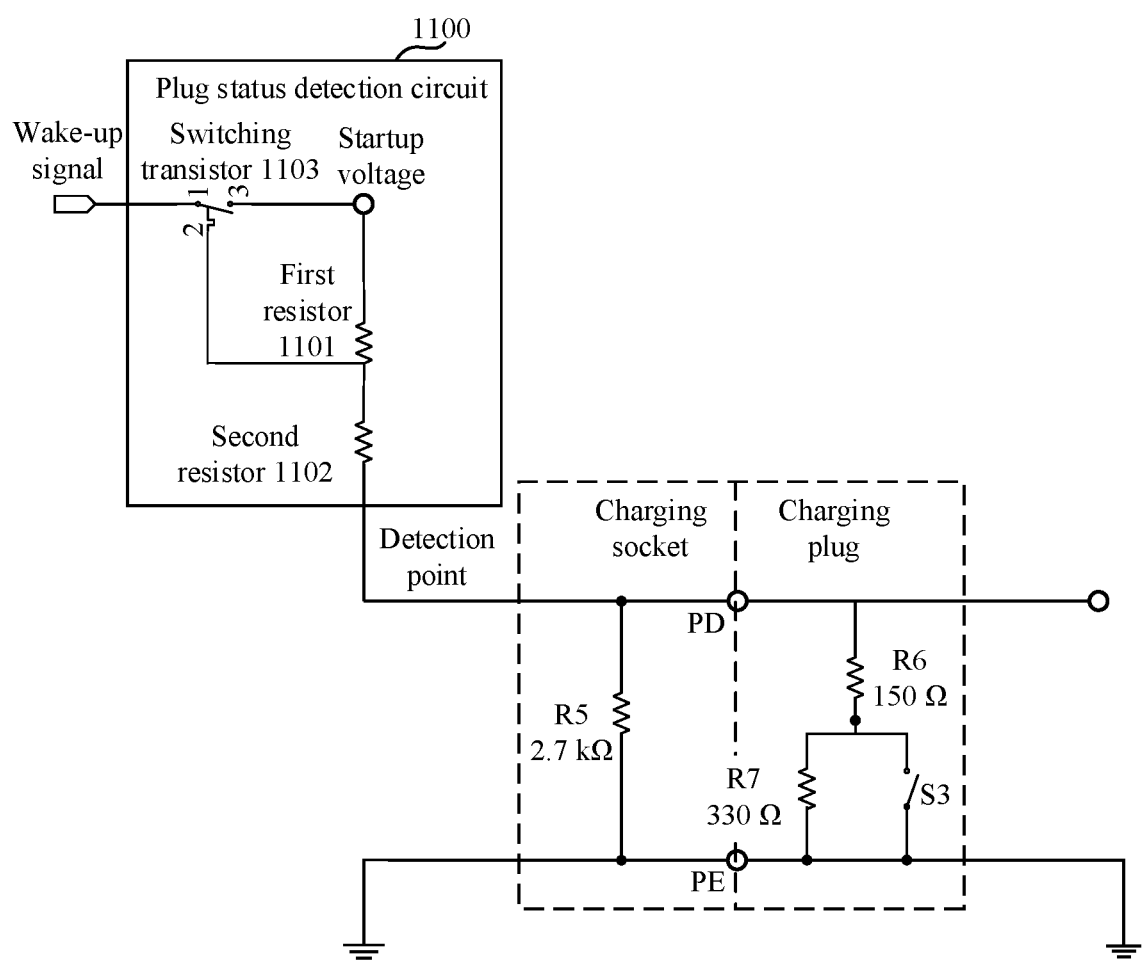
FIG. 11 is a schematic diagram of a structure of a third plug status detection circuit according to an embodiment of this application.

In addition, an embodiment of this application further provides a plug status detection circuit. Refer to FIG. 11. The plug status detection circuit 1100 includes a first resistor 1101, a second resistor 1102, and a switching transistor 1103.

A first terminal of the first resistor 1101 is configured to inject a startup voltage, and after the startup voltage is injected, a level of a detection point of the plug status detection circuit 1100 is used to indicate a plug status; a first terminal of the second resistor 1102 is coupled to a second terminal of the first resistor 1101, and a second terminal of the second resistor 1102 is coupled to the detection point; and a first terminal of the switching transistor 1103 outputs a wake-up signal when the switching transistor 1103 is switched on, a second terminal of the switching transistor 1103 is coupled to the second terminal of the first resistor 1101, a third terminal of the switching transistor 1103 is coupled to the first terminal of the first resistor 1101, and the wake-up signal is used to trigger a CPU to collect the level of the detection point.

The switching transistor 1103 is a PNP type triode, a PMOS, or another device having a similar function, and when a voltage difference between the second terminal and the third terminal is less than a particular value, the switching transistor 1103 is switched on. The second terminal of the switching transistor 1103 is a control terminal, and may be, for example, a base of the PNP type triode or a gate of the PMOS.

In one embodiment, resistance values of the first resistor 1101 and the second resistor 1102 meet the following conditions: The switching transistor 1103 is switched off when a plug is not connected to a socket, and the switching transistor 1103 is switched on when the plug is connected to the socket.

In other words, in this embodiment of this application, by adjusting the resistance values of the first resistor 1101 and the second resistor 1102, a resistance value of a connected resistor of the plug status detection circuit 1100 can meet a switch-on condition of the switching transistor 1103 under different standards when the plug is inserted into the socket. After the switching transistor 1103 is switched on, the CPU receives the wake-up signal, and then determines a plug status by collecting the level of the detection point.

Figure 12:
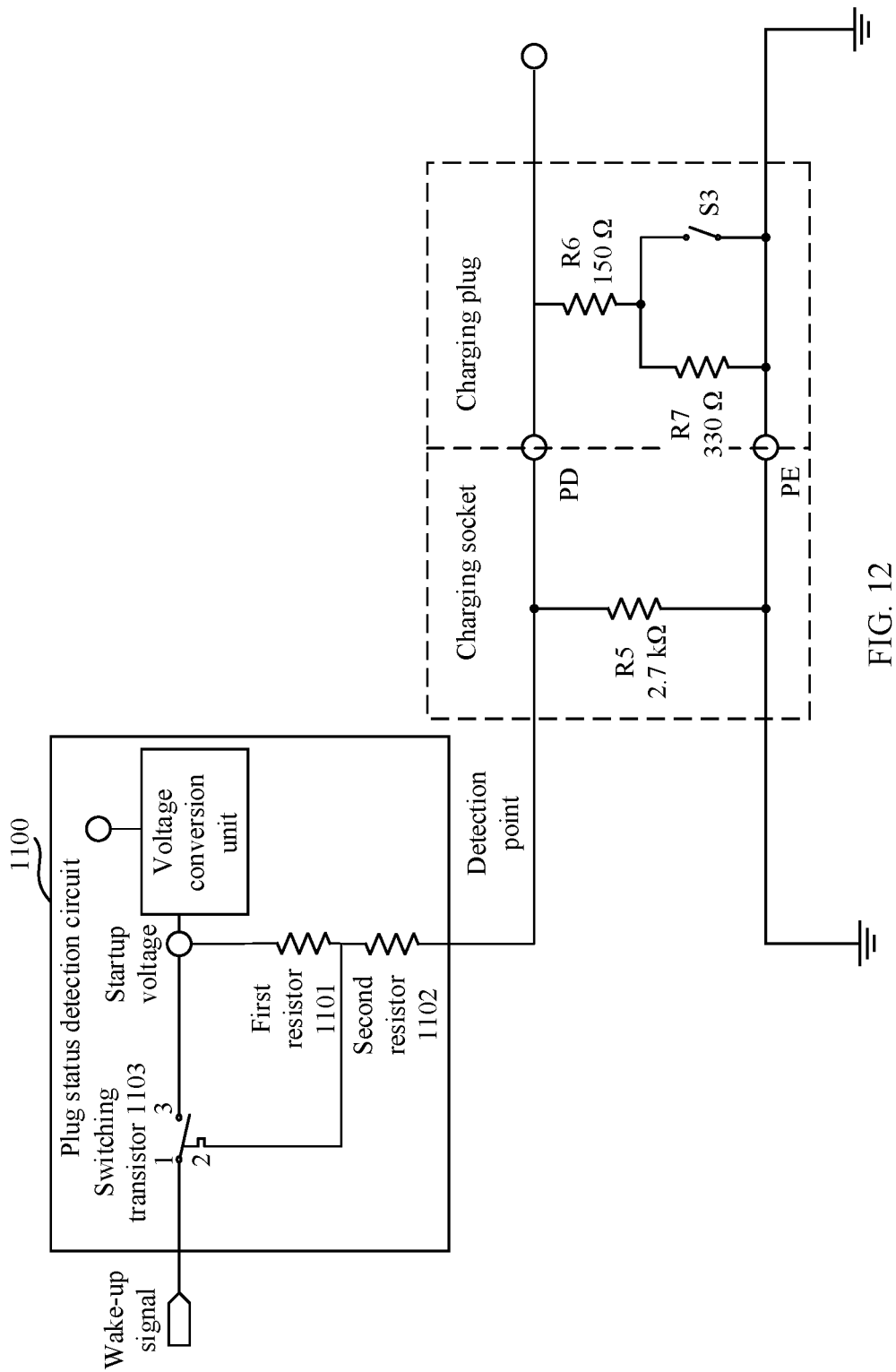
FIG. 12 is a schematic diagram of a structure of a fourth plug status detection circuit according to an embodiment of this application.

In addition, the plug status detection circuit 1100 may further include a level conversion unit. The level conversion unit is configured to convert an output voltage of a power battery into the startup voltage and inject the startup voltage into the first terminal of the first resistor, as shown in FIG. 12.

In an electric vehicle, the output voltage of the power battery is a fixed value, for example, 12 V, and this voltage value may not meet a voltage requirement for operation of the plug status detection circuit 1100. Therefore, the output voltage of the power battery may be converted by the level conversion unit, so that a converted voltage (for example, 5 V) meets the voltage requirement for the operation of the plug status detection circuit 1100.

In conclusion, when the plug status detection circuit 1100 provided in this embodiment of this application is used, the wake-up signal can be output under three standards, namely, a GB standard, an EU standard, and a US standard after the plug is inserted into the socket. After receiving the wake-up signal, the CPU collects a voltage of the detection point, and then determines plug status detection. In other words, by using the plug status detection circuit 1100 provided in this embodiment of this application, a plug status can be detected under different standards by using one detection circuit, thereby reducing a quantity of products configured on an electric vehicle side and facilitating normalized design and supply of a product.

Figure 13:
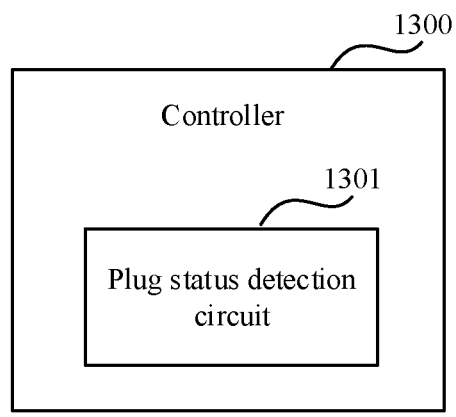
FIG. 13 is a schematic diagram of a structure of a controller according to an embodiment of this application.

An embodiment of this application further provides a controller. As shown in FIG. 13, the controller 1300 includes a plug status detection circuit 1301. The plug status detection circuit may be the plug status detection circuit 400 or the plug status detection circuit 1100.

In practical application, the controller 1300 may be a motor controller or a charging controller depending on configurations in different vehicles.

Figure 14:
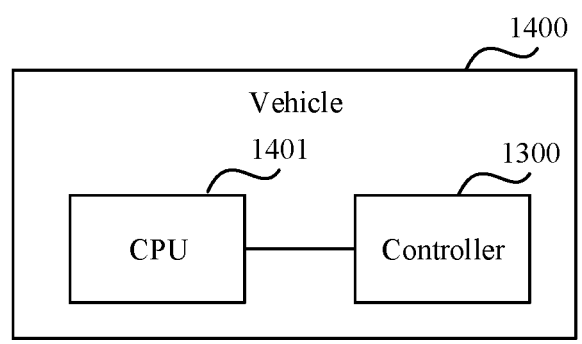
FIG. 14 is a schematic diagram of a structure of a vehicle according to an embodiment of this application.

An embodiment of this application further provides a vehicle. Refer to FIG. 14. The vehicle includes a CPU 1401 and the foregoing controller 1300.

In practical application, the CPU 1401 may be a vehicle controller or a part of a vehicle controller.

It is clearly that a person skilled in the art can make various modifications and variations to this application without departing from the scope of this application. This application is intended to cover these modifications and variations of this application provided that they fall within the scope of the claims of this application and equivalent technologies thereof.

What is claimed is:

1. A plug status detection circuit comprising:
a wake-up circuit configured to immediately output or delay outputting a wake-up signal based on a resistance value of a connected resistor of the plug status detection circuit when a plug is connected to a socket, wherein the wake-up signal is used to trigger a central processing unit (CPU) to drive a sampling circuit; and
wherein, the sampling circuit is configured to inject a startup voltage under the drive of the CPU, and after the startup voltage is injected, a level of a detection point of the sampling circuit is used to indicate a plug status.

2. The circuit according to claim 1, wherein the wake-up signal is further used to trigger the CPU to collect the level of the detection point.

3. The circuit according to claim 1, wherein the wake-up circuit is further configured to disconnect from the detection point under the control of the CPU after outputting the wake-up signal.

4. The circuit according to claim 1, wherein the wake-up circuit comprises:
a wake-up function enabling circuit configured to communicate the detection point with the wake-up circuit when the plug is connected to the socket;
a delay circuit configured to implement delayed conduction of a switching transistor;
a trigger level conversion circuit configured to trigger a wake-up signal output circuit to output the wake-up signal when the resistance value of the connected resistor of the plug status detection circuit is less than a first resistance value and the switching transistor in the delay circuit is switched off, and trigger the wake-up signal output circuit to output the wake-up signal when the resistance value of the connected resistor of the plug status detection circuit is greater than a second resistance value and the switching transistor in the delay circuit is switched on; and
the wake-up signal output circuit is configured to output the wake-up signal under the trigger of the trigger level conversion circuit.

5. The circuit according to claim 4, wherein the wake-up function enabling circuit is further configured to disconnect the detection point from the wake-up circuit under the control of the CPU after the wake-up signal output circuit outputs the wake-up signal.

6. The circuit according to claim 1, wherein the sampling circuit comprises:
a first switching transistor, wherein a first terminal of the first switching transistor is configured to input the startup voltage, and a second terminal of the first switching transistor is coupled to the CPU; and
a first resistor, wherein a first terminal of the first resistor is coupled to a third terminal of the first switching transistor, and a second terminal of the first resistor is coupled to the detection point.

7. The circuit according to claim 6, wherein the first switching transistor is an NPN type triode or an NMOS.

8. The circuit according to claim 4, wherein the wake-up function enabling circuit comprises:
a second switching transistor, wherein a first terminal of the second switching transistor is coupled to the delay circuit and the trigger level conversion circuit, a second terminal of the second switching transistor is coupled to a first terminal of a third switching transistor, and a third terminal of the second switching transistor is coupled to the detection point, wherein a second terminal of the third switching transistor is coupled to the CPU, and a third terminal of the third switching transistor is grounded; and
a second resistor, wherein a first terminal of the second resistor is coupled to the first terminal of the second switching transistor, and a second terminal of the second resistor is coupled to the first terminal of the third switching transistor.

9. The circuit according to claim 8, wherein the delay circuit comprises:
a third resistor, wherein a first terminal of the third resistor is coupled to the trigger level conversion circuit, and a second terminal of the third resistor is coupled to a first terminal of a first capacitor, wherein a second terminal of the first capacitor is coupled to the first terminal of the second switching transistor;
a fourth switching transistor, wherein a first terminal of the fourth switching transistor is coupled to the first terminal of the third resistor, a second terminal of the fourth switching transistor is coupled to the second terminal of the third resistor, and a third terminal of the fourth switching transistor is coupled to the second terminal of the first capacitor; and
a second capacitor, wherein a first terminal of the second capacitor is coupled to the second terminal of the first capacitor, and a second terminal of the second capacitor is coupled to the trigger level conversion circuit.

10. The circuit according to claim 9, wherein the trigger level conversion circuit comprises:
a fourth resistor, wherein a first terminal of the fourth resistor is configured to receive an input voltage of the wake-up circuit, and a second terminal of the fourth resistor is coupled to the second terminal of the second capacitor;

a fifth resistor, wherein a first terminal of the fifth resistor is configured to receive the input voltage of the wake-up circuit, and a second terminal of the fifth resistor is coupled to the first terminal of the second resistor;

a sixth resistor, wherein a first terminal of the sixth resistor is coupled to the second terminal of the fourth resistor, and a second terminal of the third resistor is grounded; and a fifth switching transistor, wherein a first terminal of the fifth switching transistor is coupled to the wake-up signal output circuit, a second terminal of the fifth switching transistor is coupled to the second terminal of the fourth resistor, and a third terminal of the fifth switching transistor is coupled to the first terminal of the second switching transistor.

11. The circuit according to claim 10, wherein the wake-up signal output circuit comprises:

a seventh resistor, wherein a first terminal of the seventh resistor is configured to receive the input voltage of the wake-up circuit;

an eighth resistor, wherein a first terminal of the eighth resistor is coupled to a second terminal of the seventh resistor, and a second terminal of the eighth resistor is coupled to the first terminal of the fifth switching transistor; and a sixth switching transistor, wherein a first terminal of the sixth switching transistor outputs the wake-up signal when the sixth switching transistor is switched on, a second terminal of the sixth switching transistor is coupled to the second terminal of the seventh resistor, and a third terminal of the sixth switching transistor is coupled to the first terminal of the seventh resistor.

12. The circuit according to claim 11, wherein the wake-up signal output circuit further comprises:

a third capacitor, wherein a first terminal of the third capacitor is coupled to the first terminal of the sixth switching transistor, and a second terminal of the third capacitor is configured to output the wake-up signal.

13. The circuit according to claim 11, wherein the second switching transistor, the third switching transistor, the fourth switching transistor, and the fifth switching transistor are NPN type triodes or NMOSs; and the sixth switching transistor is a PNP type triode or a PMOS.

14. A plug status detection circuit comprising:

a first resistor, wherein a first terminal of the first resistor is configured to inject a startup voltage, and after the startup voltage is injected, a level of a detection point of the plug status detection circuit is used to indicate a plug status;

a second resistor, wherein a first terminal of the second resistor is coupled to a second terminal of the first resistor, and a second terminal of the second resistor is coupled to the detection point; and a switching transistor, wherein a first terminal of the switching transistor outputs a wake-up signal when the switching transistor is switched on, a second terminal of the switching transistor is coupled to the second terminal of the first resistor, a third terminal of the switching transistor is coupled to the first terminal of the first resistor, and the wake-up signal is used to trigger a CPU to collect the level of the detection point.

15. The circuit according to claim 14, wherein resistance values of the first resistor and the second resistor meet the following conditions:

the switching transistor is switched off when a plug is not connected to a socket, and the switching transistor is switched on when the plug is connected to the socket.

16. The circuit according to claim 14, further comprising:

a level conversion unit configured to convert an output voltage of a power battery into the startup voltage and inject the startup voltage into the first terminal of the first resistor.

17. A controller comprising:

a plug status detection circuit including a wake-up circuit configured to immediately output or delay outputting a wake-up signal based on a resistance value of a connected resistor of the plug status detection circuit when a plug is connected to a socket, wherein the wake-up signal is used to trigger a central processing unit (CPU) to drive a sampling circuit; and wherein, the sampling circuit is configured to inject a startup voltage under the drive of the CPU, and after the startup voltage is injected, a level of a detection point of the sampling circuit is used to indicate a plug status.

18. The controller according to claim 17, wherein the wake-up signal is further used to trigger the CPU to collect the level of the detection point.

19. The controller according to claim 17, wherein the wake-up circuit is further configured to disconnect from the detection point under the control of the CPU after outputting the wake-up signal.

20. The controller according to claim 17, wherein the wake-up circuit comprises:

a wake-up function enabling circuit configured to communicate the detection point with the wake-up circuit when the plug is connected to the socket;

a delay circuit configured to implement delayed conduction of a switching transistor;

a trigger level conversion circuit configured to trigger a wake-up signal output circuit to output the wake-up signal when the resistance value of the connected resistor of the plug status detection circuit is less than a first resistance value and the switching transistor in the delay circuit is switched off, and trigger the wake-up signal output circuit to output the wake-up signal when the resistance value of the connected resistor of the plug status detection circuit is greater than a second resistance value and the switching transistor in the delay circuit is switched on; and the wake-up signal output circuit is configured to output the wake-up signal under the trigger of the trigger level conversion circuit.

* * * * *